United States Patent
Araki et al.

(10) Patent No.: US 11,277,919 B2
(45) Date of Patent: Mar. 15, 2022

(54) RESIN SUBSTRATE AND METHOD FOR PRODUCING RESIN SUBSTRATE

(71) Applicant: Murata Manufacturing Co., Ltd., Nagaokakyo (JP)

(72) Inventors: Shinichi Araki, Nagaokakyo (JP); Kunihiro Komaki, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/137,511

(22) Filed: Dec. 30, 2020

(65) Prior Publication Data

US 2021/0120678 A1  Apr. 22, 2021

Related U.S. Application Data

(63) Continuation of application No. PCT/JP2019/029328, filed on Jul. 26, 2019.

(30) Foreign Application Priority Data

Jul. 31, 2018  (JP) ............... JP2018-143163

(51) Int. Cl.
*H05K 1/02* (2006.01)
*H05K 3/28* (2006.01)
*H05K 1/11* (2006.01)

(52) U.S. Cl.
CPC ............ *H05K 3/282* (2013.01); *H05K 1/118* (2013.01); *H05K 1/0281* (2013.01);
(Continued)

(58) Field of Classification Search
CPC ...... H05K 1/118; H05K 1/0281; H05K 3/282; H05K 2201/09236; H05K 2201/09381;
(Continued)

(56) References Cited

U.S. PATENT DOCUMENTS 6,115,262 A * 9/2000 Brunner ............... H05K 3/3442
361/774
7,084,353 B1 * 8/2006 Downes ............... H05K 3/3442
174/261

(Continued)

FOREIGN PATENT DOCUMENTS

JP   04-025269 U   2/1992
JP   2005-175185 A   6/2005
(Continued)

OTHER PUBLICATIONS

Official Communication issued in International Patent Application No. PCT/JP2019/029328, dated Oct. 15, 2019.

*Primary Examiner* — Hoa C Nguyen
(74) *Attorney, Agent, or Firm* — Keating & Bennett, LLP

(57) ABSTRACT

A resin substrate includes a resin base material including a first main surface, electrode pads provided on the first main surface, circuit conductor patterns, a resist film, and a coverlay film. The resist film includes, on the outer circumference, a plurality of protruding portions each of which has a tapered shape with a vertex. A portion of the circuit conductor patterns are covered with the resist film, and the coverlay film covers a portion of the resist film including the protruding portions and exposed portions of the circuit conductor patterns. The protruding portions are located at positions sandwiching the exposed portions of the circuit conductor patterns.

20 Claims, 8 Drawing Sheets

(52) U.S. Cl.
CPC ............ *H05K 2201/099* (2013.01); *H05K 2201/09236* (2013.01); *H05K 2201/09381* (2013.01); *H05K 2203/0594* (2013.01); *H05K 2203/0597* (2013.01)

(58) Field of Classification Search
CPC ..... H05K 2201/099; H05K 2203/0594; H05K 2203/0597
See application file for complete search history.

(56) References Cited

U.S. PATENT DOCUMENTS

| | | | | |
|---|---|---|---|---|
| 8,659,168 | B2* | 2/2014 | Nishimura | H01L 24/83 257/778 |
| 8,669,665 | B2* | 3/2014 | Araki | H01L 23/3171 257/786 |
| 2007/0201193 | A1* | 8/2007 | Tsuji | H01L 23/49816 361/820 |
| 2008/0142993 | A1* | 6/2008 | Ozawa | H01L 23/49838 257/778 |
| 2008/0202804 | A1* | 8/2008 | Fakutomi | H05K 3/3452 174/267 |
| 2008/0217048 | A1* | 9/2008 | Kamei | H05K 3/243 174/258 |
| 2010/0022034 | A1* | 1/2010 | Antol | H05K 3/3452 438/15 |
| 2012/0012376 | A1* | 1/2012 | Li | H05K 3/3452 174/261 |
| 2012/0031658 | A1* | 2/2012 | Son | H05K 3/3452 174/261 |
| 2014/0176264 | A1 | 6/2014 | Tago et al. | |
| 2014/0233249 | A1* | 8/2014 | Lee | F21K 9/00 362/382 |
| 2017/0280569 | A1* | 9/2017 | Schriel | H05K 3/3436 |
| 2019/0173208 | A1 | 6/2019 | Sasaki et al. | |

FOREIGN PATENT DOCUMENTS

| | | |
|---|---|---|
| JP | 2005-340382 A | 12/2005 |
| WO | 2013/069763 A1 | 5/2013 |
| WO | 2018/037871 A1 | 3/2018 |

\* cited by examiner

RESIN SUBSTRATE AND METHOD FOR PRODUCING RESIN SUBSTRATE

CROSS REFERENCE TO RELATED APPLICATIONS

This application claims the benefit of priority to Japanese Patent Application No. 2018-143163 filed on Jul. 31, 2018 and is a Continuation Application of PCT Application No. PCT/JP2019/029328 filed on Jul. 26, 2019. The entire contents of each application are hereby incorporated herein by reference.

BACKGROUND OF THE INVENTION

1. Field of the Invention

The present invention relates to a resin substrate and a method for producing the same, and more particularly to a resin substrate including a resist film and a coverlay film on a surface of a resin base material and a method for producing the same.

2. Description of the Related Art

Conventionally, it is common to attach a coverlay film to the surface of a flexible resin base material in order to protect conductor patterns (electrode pads, conductor patterns for circuits, and the like) formed on the surface of the resin base material (JP 2005-340382 A). By using the coverlay film having high stretchability, it is possible to provide a resin substrate that maintains flexibility, without impairing the flexibility of the resin base material. However, the stretchable coverlay film is likely to be deformed or displaced when it is attached to the surface of the resin base material and, thus, has low patterning accuracy.

On the other hand, a resist film patterned by photolithography has high patterning accuracy but low stretchability. If such a resist film is formed on the surface of the resin base material, the flexibility of the resin substrate is lowered.

In order to eliminate the above-mentioned decrease in the flexibility of the resin substrate, it is conceivable to form a resist film only around electrode pads formed on the surface of the resin base material (non-bending portions of the resin base material) and attach a coverlay film to the surface of the resin base material in the other part while covering a part of the resist film.

However, when a part of the resist film is covered with the coverlay film, minute gaps are likely to be formed along the boundary between the outer circumference of the resist film and the coverlay film, and external moisture (for example, a plating solution for plating the electrode pads) may infiltrate into the gaps. The infiltrating moisture may cause, for example, corrosion of the conductor patterns for circuits disposed on the surface of the resin base material, which may change the electrical characteristics of the resin substrate.

SUMMARY OF THE INVENTION

Preferred embodiments of the present invention provide resin substrates that each reduce or prevent changes in electrical characteristics caused by the infiltration of moisture in a structure in which a portion of a resist film on a resin base material is covered with a coverlay film, by reducing or preventing the infiltration of moisture into gaps between the resist film and the coverlay film, and provide method for producing such resin substrates.

A resin substrate according to a preferred embodiment of the present invention includes a resin base material including a main surface; an electrode pad provided on the main surface; a resist film that includes, on an outer circumference, a plurality of protruding portions protruding along the main surface, is provided on the main surface, and covers an entire outer circumference of the electrode pad; a circuit conductor pattern that is provided on the main surface and is partially covered with the resist film; and a coverlay film that is provided on the main surface and covers a portion of the resist film including the plurality of protruding portions and a part of an exposed portion of the circuit conductor pattern, the exposed portion not being covered with the resist film. Each of the plurality of protruding portions includes a tapered shape with a vertex, and at least two of the plurality of protruding portions are located at positions sandwiching the exposed portion of the circuit conductor pattern.

The coverlay film is able to be easily attached along (following) the outer circumference of the resist film adjacent to or in a vicinity of the vertices of the tapered protruding portions. Thus, adjacent to or in a vicinity of the vertices of the tapered protruding portions, gaps are unlikely to be formed in the boundary between the resin base material, the outer circumference of the resist film, and the coverlay film. By sandwiching the exposed portion of the circuit conductor pattern not covered with the resist film between the plurality of protruding portions, the moisture that has infiltrated such gaps is prevented from reaching the circuit conductor pattern. Therefore, corrosion of the circuit conductor pattern or the like resulting from the infiltrating moisture is able to be significantly reduced or prevented, and changes in the characteristics of the resin substrate are able to be significantly reduced or prevented.

A method for producing a resin substrate according to a preferred embodiment of the present invention includes a base material forming step of forming a resin base material provided with an electrode pad and a circuit conductor pattern formed on a main surface; a resist film forming step of forming a resist film on the main surface after the base material forming step, the resist film including, on an outer circumference, a plurality of protruding portions protruding along the main surface and covering an entire outer circumference of the electrode pad and a portion of the circuit conductor pattern; and a film forming step of forming a coverlay film on the main surface after the resist film forming step, the coverlay film covering a portion of the resist film including the plurality of protruding portions and a part of an exposed portion of the circuit conductor pattern, the exposed portion not being covered with the resist film. Each of the plurality of protruding portions includes a tapered shape with a vertex, and at least two of the plurality of protruding portions are located at positions sandwiching the exposed portion of the circuit conductor pattern.

With the producing method described above, a resin substrate that reduces or prevents characteristic changes caused by the infiltration of moisture into gaps between the outer circumference of the resist film and the coverlay film is able to be easily provided.

Preferred embodiments of the present invention are able to provide resin substrates that each reduce or prevent changes in electrical characteristics caused by the infiltration of moisture in a structure in which a portion of a resist film on a resin base material is covered with a coverlay film by reducing or preventing the infiltration of moisture into gaps between the resist film and the coverlay film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
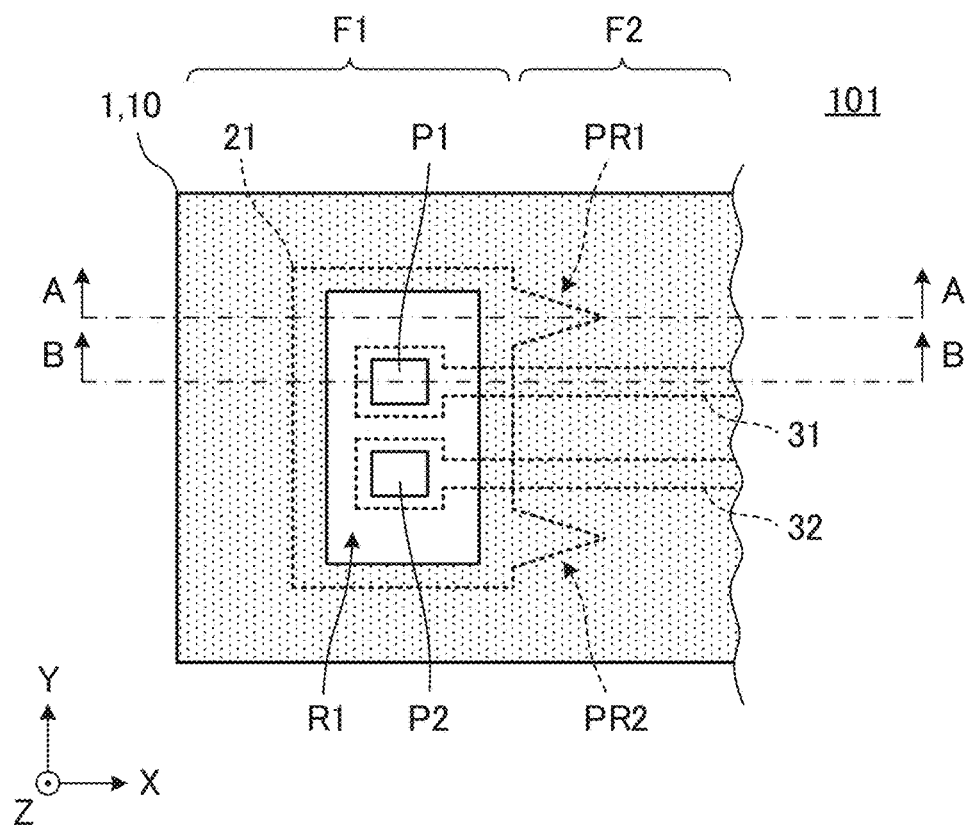
FIG. 1A is an enlarged plan view of a first end portion of a resin substrate according to a first preferred embodiment of the present invention.

Hereinafter, preferred embodiments of the present invention will be described with some specific examples with reference to the drawings. In each drawing, the same or similar components and elements are designated by the same reference numerals. Although preferred embodiments are described separately, for convenience, in consideration of the description of main points or the ease of understanding, configurations described in different preferred embodiments may be partially replaced or combined. In second and subsequent preferred embodiments, a description of matters common to a first preferred embodiment will be omitted, and only different points will be described. In particular, similar advantageous effects provided by similar elements and structures will not be sequentially described for each preferred embodiment.

First Preferred Embodiment

Figure 1B:
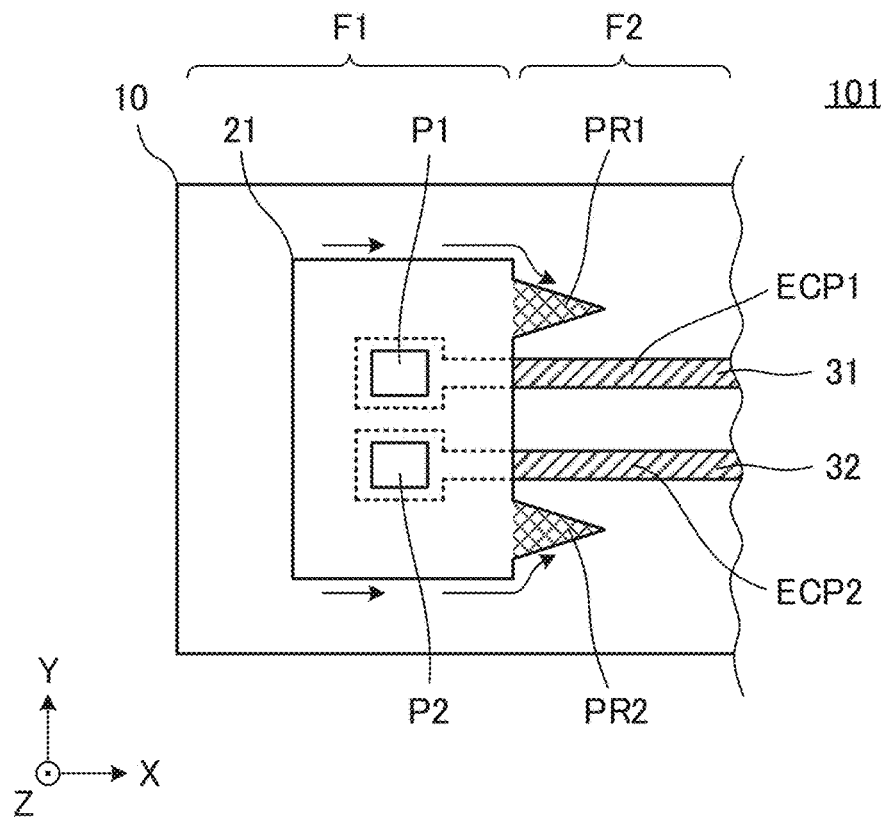
FIG. 1B is an enlarged plan view illustrating the first end portion of the resin substrate, from which a coverlay film is removed.
Figure 2A:
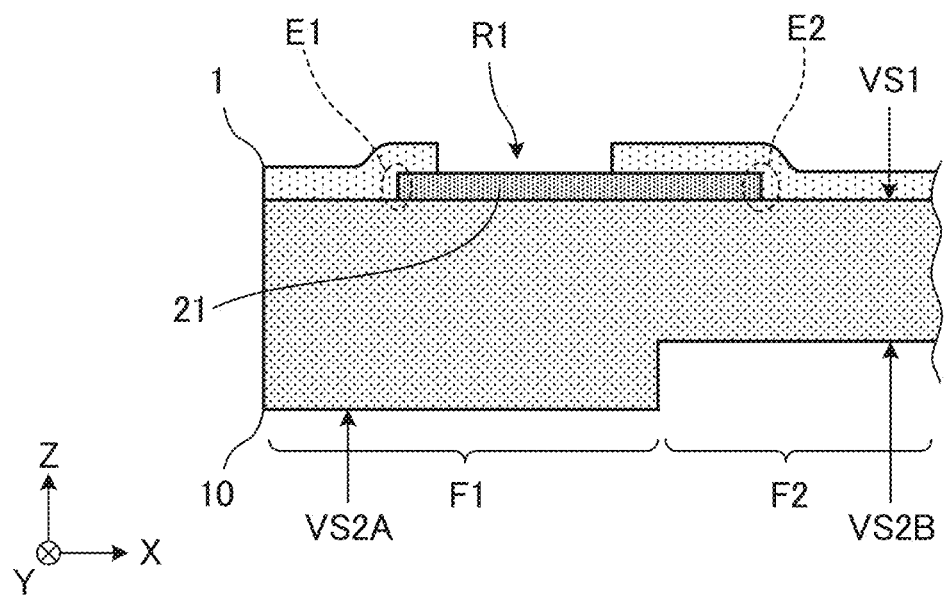
FIG. 2A is a sectional view taken along line A-A in FIG. 1A.
Figure 2B:
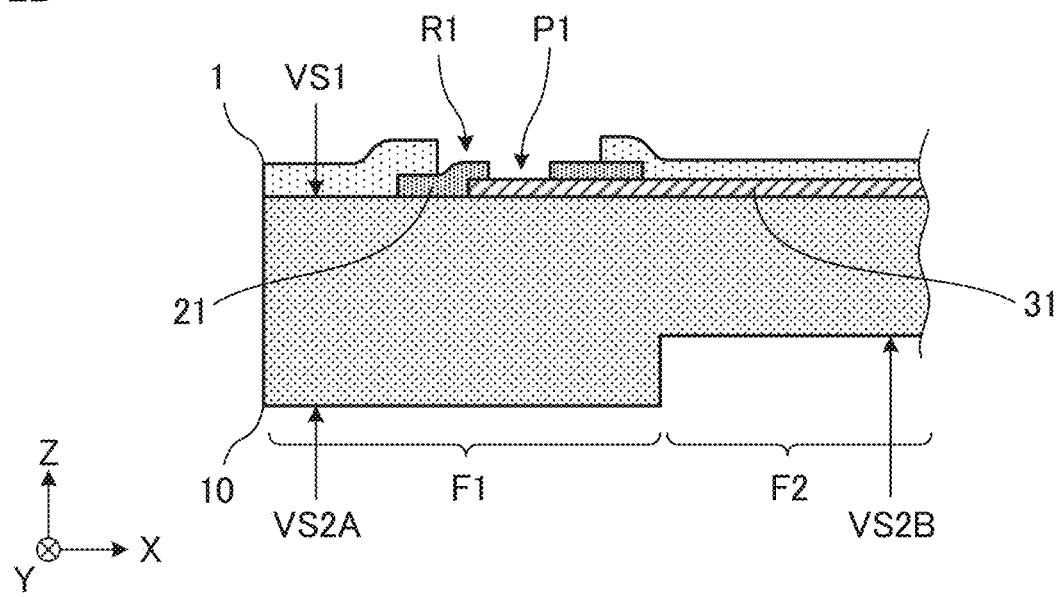
FIG. 2B is a sectional view taken along line B-B in FIG. 1A.

FIG. 1A is an enlarged plan view of a first end portion of a resin substrate 101 according to a first preferred embodiment of the present invention, and FIG. 1B is an enlarged plan view illustrating the first end portion of the resin substrate 101, from which a coverlay film 1 removed. FIG. 2A is a sectional view taken along line A-A in FIG. 1A, and FIG. 2B is a sectional view taken along line B-B in FIG. 1A. In FIG. 1A, the coverlay film 1 is illustrated by a dot pattern in order to make the structure easy to understand. In FIG. 1B, exposed portions of circuit conductor patterns 31 and 32 are illustrated by hatching, and protruding portions PR1 and PR2 are illustrated by cross-hatching. Although not illustrated, a second end portion of the resin substrate 101 has the same or similar structure as the first end portion.

The resin substrate 101 includes a resin base material 10, electrode pads P1 and P2, the circuit conductor patterns 31 and 32, a resist film 21, the coverlay film 1, and the like.

The resin base material 10 is a rectangular or substantially rectangular flat plate that includes a thermoplastic resin as the main material and has a longitudinal direction coinciding with an X-axis direction. Although not illustrated, the resin base material 10 is provided by laminating a plurality of insulating base material layers. The resin base material 10 is a flat plate including, for example, a liquid crystal polymer (LCP) or a polyetheretherketone (PEEK), as the main material.

The resin base material 10 includes a first area F1 and a second area F2. The thickness of the resin base material 10 in the second area F2 (thickness in a Z-axis direction) is smaller than the thickness of the resin base material 10 in the first area F1. Thus, the second area F2 of the resin base material 10 is more easily bent and more flexible than the first area F1. The second area F2 is a portion that is able to be bent by utilizing flexibility (flexible portion) when the resin substrate 101 is connected to another circuit board or the like, and the first area F1 is a portion that is not bent (rigid portion).

Furthermore, the resin base material 10 includes a first main surface VS1 and second main surfaces VS2A and VS2B facing each other. As illustrated in FIGS. 2A and 2B, the first main surface VS1 is a surface provided over the first area F1 and the second area F2. The second main surface VS2A is a surface provided in the first area F1, and the second main surface VS2B is a surface provided in the second area F2.

The electrode pads P1 and P2 are rectangular or substantially rectangular conductor patterns provided on the first main surface VS1. Both the electrode pads P1 and P2 are located in the first area F1. The circuit conductor patterns 31 and 32 are linear or substantially linear conductor patterns provided on the first main surface VS1 of the resin base material 10. The circuit conductor patterns 31 and 32 extend in a first direction (X-axis direction) and are laid in parallel or substantially in parallel with each other. As illustrated in FIG. 1B and the like, one end of the circuit conductor pattern 31 is connected to the electrode pad P1, and one end of the circuit conductor pattern 32 is connected to the electrode pad P2. The electrode pads P1 and P2 and the circuit conductor patterns 31 and 32 are conductor patterns of Cu or the like, for example. The circuit conductor patterns 31 and 32 according to the present preferred embodiment are signal lines.

The resist film 21 is a rectangular or substantially rectangular protective film provided on the first main surface VS1. The resist film 21 is provided in the first area F1 to cover the entire or substantially the entire outer circumference of the electrode pads P1 and P2 and a portion of the circuit conductor patterns 31 and 32 (the portion located in the first area F1). The resist film 21 is preferably, for example, an epoxy resin film.

As illustrated in FIGS. 1B and 2A, the resist film 21 includes a plurality of protruding portions PR1 and PR2 protruding along the first main surface VS1 on the outer circumference. The plurality of protruding portions PR1 and PR2 have the same or substantially the same shape, which is a tapered shape with one vertex and is a shape different from the planar shape of the conductor patterns. More specifically, the plurality of protruding portions PR1 and PR2 are linear or substantially linear tapers extending in the first direction (+X direction) and including sharply angled vertices. The two protruding portions PR1 and PR2 are provided on a first side of the resist film 21, which is rectangular or substantially rectangular (the right side of the resist film 21 in FIGS. 1A and 1B). In the present preferred embodiment, the two protruding portions PR1 and PR2 are provided adjacent to or in a vicinity of exposed portions ECP1 and ECP2 of the circuit conductor patterns 31 and 32 to be protected, and are located symmetrically or substantially symmetrically in a Y-axis direction with respect to the center line of the area in which the exposed portions ECP1 and ECP2 of the circuit conductor patterns 31 and 32 are provided.

The coverlay film 1 is a rectangular or substantially rectangular protective film that is flexible and is provided (attached) to substantially the entire first main surface VS1. The coverlay film 1 covers a portion of the resist film 21 including the plurality of protruding portions PR1 and PR2 and the exposed portions ECP1 and ECP2 not covered with the resist film 21 in the circuit conductor patterns 31 and 32 (refer to FIG. 1B). The coverlay film 1 includes a rectangular or substantially rectangular opening R1 corresponding to the position where the electrode pads P1 and P2 are provided. Thus, as illustrated in FIGS. 1A, 2B, and the like, even though the coverlay film 1 covers substantially the entire surface of the first main surface VS1, a portion of the resist film 21 and a portion of the electrode pads P1 and P2 are exposed to the outside. The coverlay film 1 is preferably, for example, a film including polyimide (PI).

As illustrated in FIG. 1B, two of the protruding portions PR1 and PR2 are located at positions sandwiching the exposed portions ECP1 and ECP2 of the circuit conductor patterns 31 and 32. Furthermore, as illustrated in FIG. 1A, the coverlay film 1 covers the entire or substantially the entire outer circumference of the resist film 21.

Figure 3A:
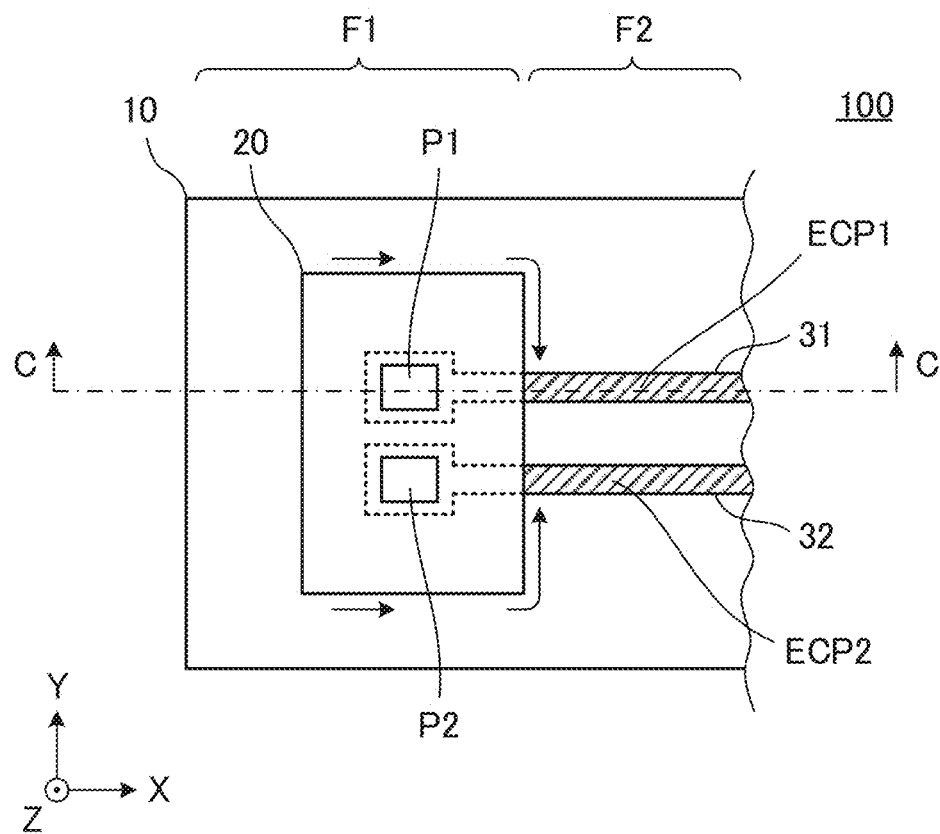
FIG. 3A is an enlarged plan view illustrating a first end portion of a resin substrate according to a comparative example.
Figure 3B:
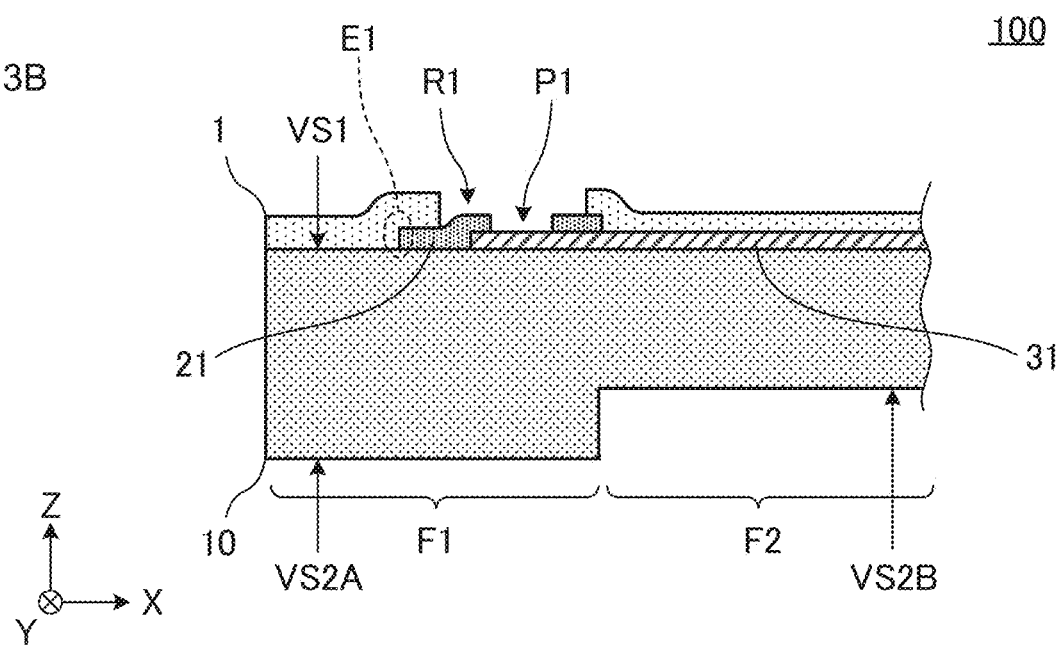
FIG. 3B is a sectional view taken along line C-C in FIG. 3A.

Next, the advantages of locating the two protruding portions PR1 and PR2 at positions sandwiching the exposed portions ECP1 and ECP2 of the circuit conductor patterns 31 and 32 will be described in comparison with a comparative example. FIG. 3A is an enlarged plan view illustrating a first end portion of a resin substrate 100 according to a comparative example, and FIG. 3B is a sectional view taken along line C-C in FIG. 3A. Note that FIG. 3A illustrates the state without the coverlay film 1 in order to make the structure easy to understand.

As illustrated in FIG. 3A, the resist film 20 included in the resin substrate 100 has no protruding portion on the outer circumference. The other features of the resin substrate 100 are the same as or similar to the features of the resin substrate 101.

When at least a portion of the outer circumference of the resist film provided on the first main surface VS1 is covered with the coverlay film 1, a small gap is likely to be formed along the boundary between the outer circumference of the resist film and the coverlay film 1 (see a boundary E1 in FIG. 2A and FIG. 3B). Along this gap, external moisture (for example, a plating solution to plate the electrode pads P1 and P2 or the like) may infiltrate (see the arrows in FIG. 3A).

Then, when the infiltrating moisture reaches the circuit conductor patterns 31 and 32, corrosion of the circuit conductor patterns 31 and 32 or the like is caused, and thus their characteristics may change (for example, when the plurality of circuit conductor patterns have different potentials, short circuits or changes in capacitance between the plurality of circuit conductor patterns, formation of capacitance between the corrosive material of the circuit conductor patterns and other conductors, and the like).

In contrast, the resin substrate 101 according to the present preferred embodiment includes the resist film 21 including the plurality of tapered protruding portions PR1 and PR2 on the outer circumference. It is easy to attach the coverlay film 1 along (following) the outer circumference of the resist film 21 adjacent to or in a vicinity of the vertices of the tapered protruding portions PR1 and PR2. Thus, adjacent to or in a vicinity of the vertices of the tapered protruding portions PR1 and PR2, gaps are unlikely to be formed in the boundary between the resin base material 10, the outer circumference of the resist film 21, and the coverlay film 1.

In addition, by locating the two protruding portions PR1 and PR2 at positions sandwiching the exposed portions ECP1 and ECP2 of the circuit conductor patterns 31 and 32, the moisture that has infiltrated such gaps is prevented from reaching the exposed portions ECP1 and ECP2 of the circuit conductor patterns 31 and 32. Therefore, with the features described above, corrosion of the circuit conductor patterns 31 and 32 or the like resulting from the infiltrating moisture is able to be reduced or prevented, and changes in the characteristics of the resin substrate are able to be reduced or prevented.

In the present preferred embodiment, an example in which each of the protruding portions PR1 and PR2 includes a tapered shape with one vertex is described. However, the planar shape of the protruding portions is not limited to the above-described one. As will be described below, the planar shape of the protruding portions may be, for example, a tapered shape with a plurality of vertices, such as a trapezoid. Note that since a tapered protruding portion including a tapered shape with one vertex as in the present preferred embodiment provides a stronger degree of adhesion (degree of adhesion between the resin base material 10, the resist film 21, and the coverlay film 1) adjacent to or in a vicinity of the vertex (tip end portion) than a protruding portion including a tapered shape with a plurality of vertices, it is more unlikely that gaps are formed at the boundary. Thus, the protruding portions preferably have, for example, a tapered shape with one vertex, rather than a tapered shape with a plurality of vertices.

When the exposed portions ECP1 and ECP2 of the plurality of circuit conductor patterns 31 and 32 are located close to each other as in the present preferred embodiment, the two protruding portions preferably sandwich the plurality of circuit conductor patterns 31 and 32, for example. As a result, changes in the characteristics of the resin substrate due to the infiltration of moisture are able to be reduced or prevented with a small number of protruding portions (two protruding portions).

Furthermore, in the present preferred embodiment, the coverlay film 1 covers the entire or substantially the entire outer circumference of the resist film 21. Accordingly, as compared with a case where the coverlay film does not cover the entire or substantially the entire outer circumference of the resist film 21, the infiltration of external moisture into gaps between the resin base material 10, the outer circumference of the resist film 21, and the coverlay film 1 is able to be reduced or prevented.

Furthermore, in the present preferred embodiment, the resist film 21 excluding the protruding portions PR1 and PR2, is provided only in the first area F1, which is a rigid portion. Accordingly, a resin substrate that maintains the flexibility of the second area F2, which is a flexible portion, is able to be provided. The protruding portions are preferably located, for example, in the second area F2. Specifically, for example, the coverlay film 1 is preferably provided to make the second area F2, which is a flexible portion, have bendability (flexibility). However, in the flexible second area F2, a gap is likely to be formed at the boundary between the resin base material 10, the outer circumference of the resist film 21, and the coverlay film 1. Accordingly, the protruding portions are preferably located in the second area F2, for example.

The resin substrate 101 according to the present preferred embodiment is produced, for example, in the following non-limiting examples of processes.

First, the electrode pads P1 and P2 and the circuit conductor patterns 31 and 32 are formed on the first main surface VS1 of the resin base material 10. Specifically, metal foil (for example, Cu foil) is laminated on the first main surface VS1 of the resin base material 10, and the metal foil is patterned by photolithography to form the electrode pads P1 and P2 and the circuit conductor patterns 31 and 32 on the first main surface VS1 of the resin base material 10. The resin base material 10 is a flat plate preferably including, for example, a liquid crystal polymer (LCP) or a polyetheretherketone (PEEK), as the main material.

The process described above to form the resin base material 10 with the first main surface VS1 on which the electrode pads P1 and P2 and the circuit conductor patterns 31 and 32 are formed is an example of the "base material forming step."

Note that, the resin base material 10 may be a laminate including a plurality of insulating base material layers. Accordingly, after the electrode pads P1 and P2 and the circuit conductor patterns 31 and 32 are formed on the surface of an insulating base material layer that will later define and function as the first main surface VS1, a plurality of insulating base material layers are laminated and then heat-pressed, and the resin base material 10 is able to be formed.

Next, the resist film 21 is formed on the first main surface VS1 of the resin base material 10. Specifically, a thermosetting resin is applied to the first main surface VS1 of the resin base material 10, and the resin is patterned by photolithography to form a resist film with a desired shape. The resist film 21 includes, on the outer circumference, the plurality of protruding portions PR1 and PR2 protruding along the first main surface VS1, and covers the entire or substantially the entire outer circumference of the electrode pads P1 and P2 and a portion of the circuit conductor patterns 31 and 32. Each of the plurality of protruding portions PR1 and PR2 has a tapered shape with a vertex. Furthermore, two of the protruding portions PR1 and PR2 are located at positions sandwiching the exposed portions, which is not covered with the resist film 21, of the circuit conductor patterns 31 and 32. The resist film 21 is preferably, for example, an epoxy resin film.

The process described above to form the resist film 21 on the first main surface VS1 after the "base material forming step" is an example of the "resist film forming step."

Next, the coverlay film 1 of the resin base material 10 is formed on the first main surface VS1. Specifically, a protective film with an adhesive is attached to substantially the entire surface of the first main surface VS1 of the resin base material 10. The coverlay film 1 covers a portion of the resist film 21 including the plurality of protruding portions PR1 and PR2 and the exposed portions of the circuit conductor patterns 31 and 32. The coverlay film 1 includes the opening R1 corresponding to the position where the electrode pads P1 and P2 are located. Thus, even though the coverlay film 1 covers substantially the entire surface of the first main surface VS1, a portion of the resist film 21 and a portion of the electrode pads P1 and P2 are exposed to the outside. The coverlay film 1 is preferably, for example, a film including polyimide (PI).

The process described above to form the coverlay film 1 on the first main surface VS1 after the "resist film forming step" is an example of the "film forming step."

With the producing method described above, the resin substrate 101 is able to be easily obtained, with which characteristic changes caused by the infiltration of moisture into gaps between the outer circumference of the resist film 21 and the coverlay film 1 is reduced or prevented.

Second Preferred Embodiment

In a second preferred embodiment of the present invention, an example in which the shape of protruding portions differs from the protruding portions PR1 and PR2 in the first preferred embodiment is described.

Figure 4A:
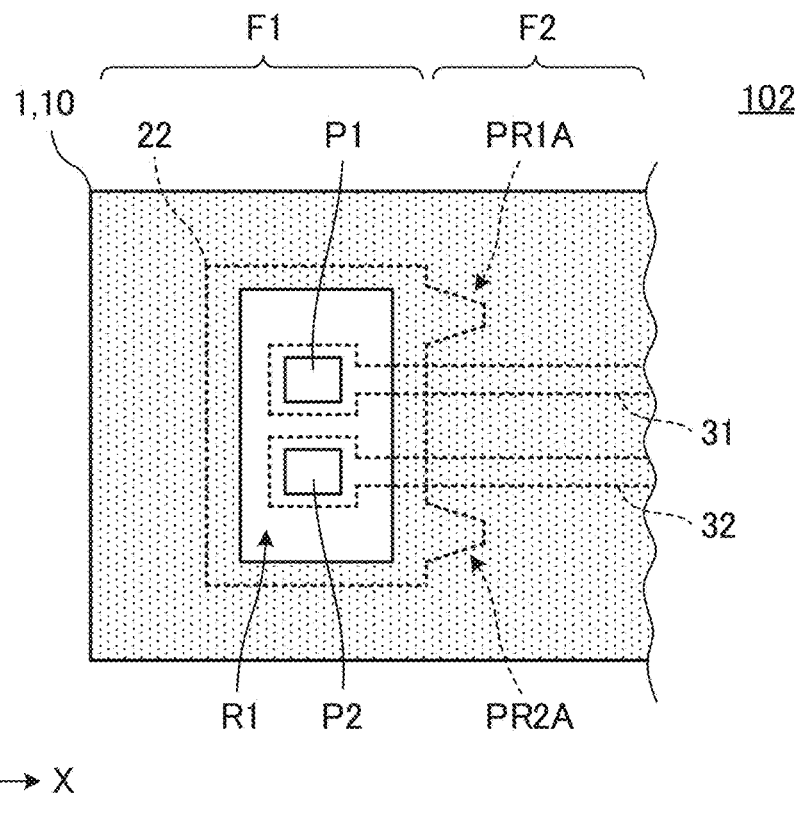
FIG. 4A is an enlarged plan view of a first end portion of a resin substrate according to a second preferred embodiment of the present invention.
Figure 4B:
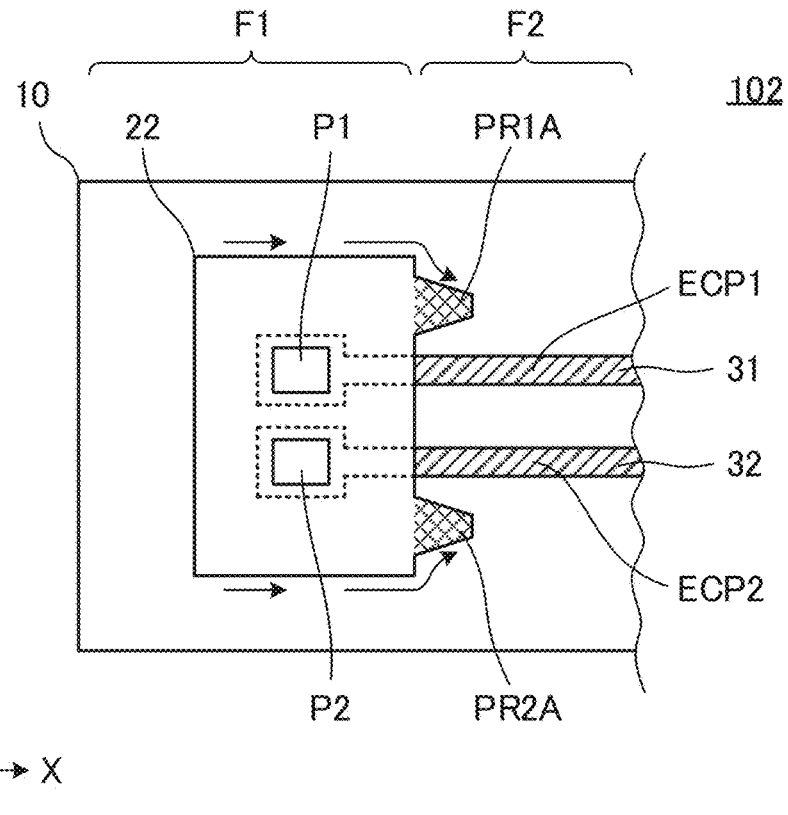
FIG. 4B is an enlarged plan view illustrating the first end portion of the resin substrate, from which a coverlay film is removed.

FIG. 4A is an enlarged plan view of a first end portion of a resin substrate 102 according to the second preferred embodiment, and FIG. 4B is an enlarged plan view illustrating the first end portion of the resin substrate 102, from which a coverlay film 1 is removed. In FIG. 4A, the coverlay film 1 is illustrated by a dot pattern in order to make the structure easy to understand. In FIG. 4B, exposed portions of circuit conductor patterns 31 and 32 are illustrated by hatching, and protruding portions PR1A and PR2A are illustrated by cross-hatching. Although not illustrated, a second end portion of the resin substrate 102 has the same or similar structure as the first end portion.

The resin substrate 102 differs from the resin substrate 101 according to the first preferred embodiment in that the resin substrate 102 includes a resist film 22 including the plurality of protruding portions PR1A and PR2A on the outer circumference. The other features of the resin substrate 102 are the same as or similar to the features of the resin substrate 101.

As illustrated in FIGS. 4A and 4B, the plurality of protruding portions PR1A and PR2A have the same or similar shape, which is a tapered shape with a plurality of vertices. More specifically, the plurality of protruding portions PR1A and PR2A are tapered trapezoids.

Accordingly, the same or similar advantageous actions and effects as those of the resin substrate 101 according to the first preferred embodiment are able to be obtained.

Third Preferred Embodiment

In a third preferred embodiment of the present invention, an example in which the shape of protruding portions differs from the protruding portions PR1 and PR2 in the first preferred embodiment is described.

Figure 5:
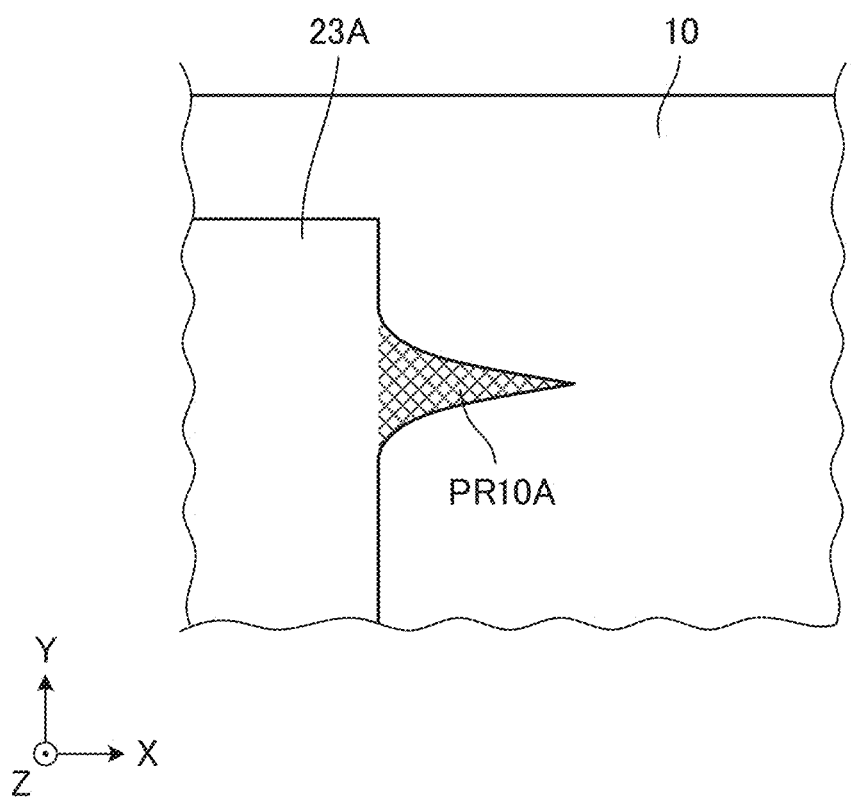
FIG. 5 is an enlarged plan view illustrating a protruding portion of a resin substrate according to a third preferred embodiment of the present invention.
Figure 6A:
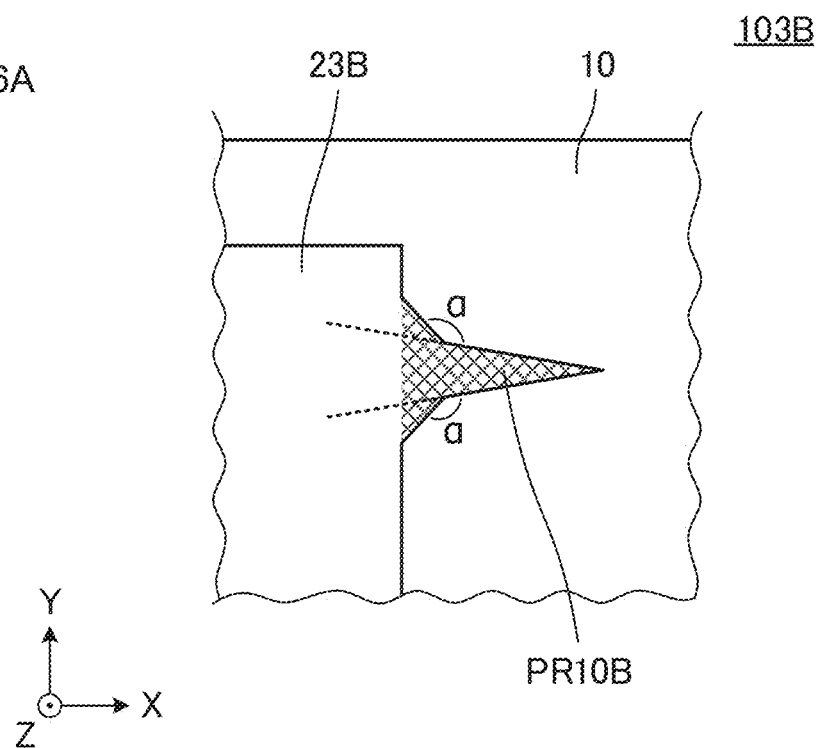
FIG. 6A is an enlarged plan view illustrating a protruding portion of another resin substrate according to the third preferred embodiment.
Figure 6B:
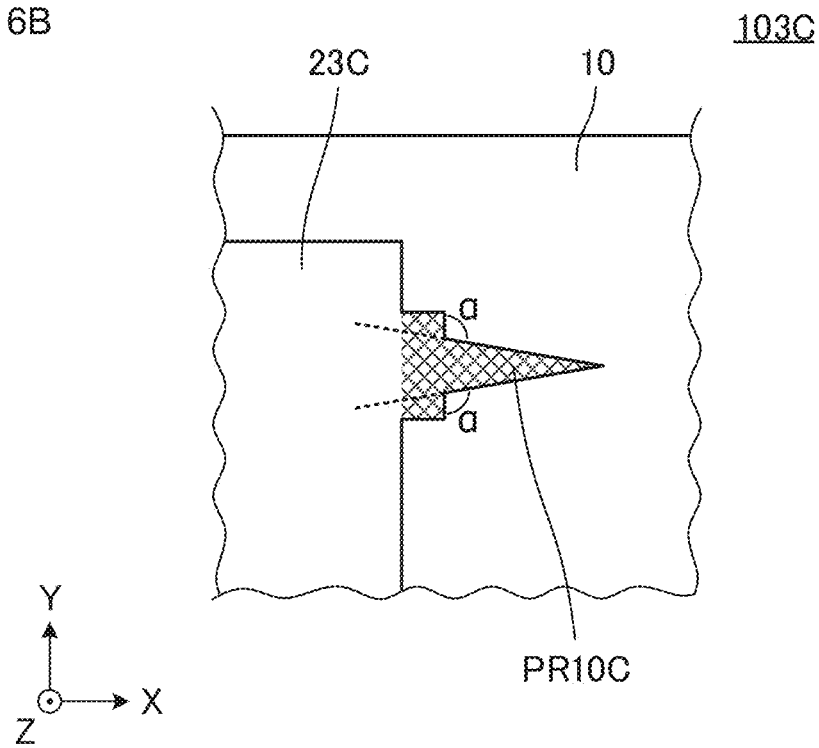
FIG. 6B is an enlarged plan view illustrating a protruding portion of another resin substrate according to the third preferred embodiment of the present invention.

FIG. 5 is an enlarged plan view illustrating a protruding portion PR10A of a resin substrate 103A according to the third preferred embodiment. FIG. 6A is an enlarged plan view illustrating a protruding portion PR10B of another resin substrate 103B according to the third preferred embodiment, and FIG. 6B is an enlarged plan view illustrating a protruding portion PR10C of another resin substrate 103C according to the third preferred embodiment.

The resin substrate 103A differs from the resin substrate 101 according to the first preferred embodiment in that the resin substrate 103A includes a resist film 23A including the protruding portion PR10A on the outer circumference. The other features of the resin substrate 103A are the same as or similar to the features of the resin substrate 101.

As illustrated in FIG. 5, the protruding portion PR10A has a tapered shape like an exponential chart with a sharply angled vertex (exponential taper). Although not illustrated, protruding portions other than the protruding portion PR10A have the same or similar shape.

The resin substrate 103B differs from the resin substrate 101 according to the first preferred embodiment in that the resin substrate 103B includes a resist film 23B including the protruding portion PR10B on the outer circumference. The other features of the resin substrate 103B are the same as or similar to the features of the resin substrate 101.

As illustrated in FIG. 6A, the protruding portion PR10B has a tapered shape with a sharply angled vertex and bending in two steps. Although not illustrated, protruding portions other than the protruding portion PR10B have the same or similar shape.

The resin substrate 103B differs from the resin substrate 101 according to the first preferred embodiment in that the resin substrate 103B includes a resist film 23C including the protruding portion PR10C on the outer circumference. The other features of the resin substrate 103C are the same as or similar to the features of the resin substrate 101.

As illustrated in FIG. 6B, the protruding portion PR10C has a tapered shape with a sharply angled vertex and bending in three steps. Although not illustrated, protruding portions other than the protruding portion PR10C have the same or similar shape.

As in the protruding portions PR10B and PR10C illustrated in FIGS. 6A and 6B, the protruding portions may be bent in two or more steps. Note that in the case where protruding portions have a shape that bends in two or more steps, a shape that bends to be more sharply toward the vertex is referred to as a "tapered shape." Specifically, the tapered shape is defined as the shape of a protruding portion including a sharply angled vertex with an angle α defined by a line segment extending from the vertex of the protruding portion and an intersecting line segment is less than 180°.

Fourth Preferred Embodiment

In a fourth preferred embodiment of the present invention, an example of a resin substrate including three or more protruding portions is described.

Figure 7:
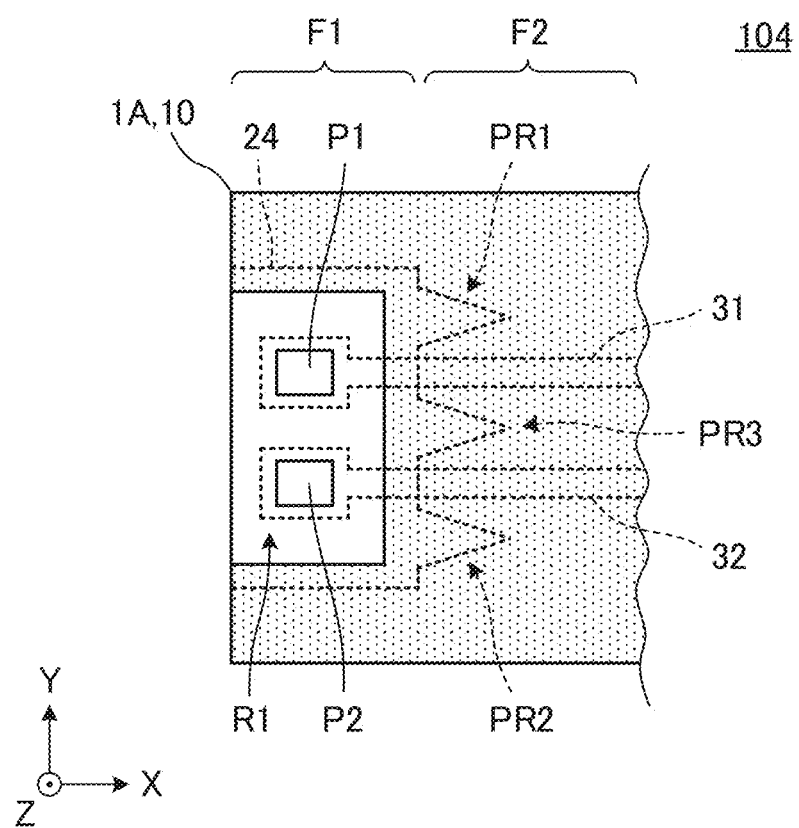
FIG. 7 is an enlarged plan view of a first end portion of a resin substrate according to a fourth preferred embodiment of the present invention.

FIG. 7 is an enlarged plan view of a first end portion of a resin substrate 104 according to the fourth preferred embodiment. In FIG. 7, a coverlay film 1A is illustrated by a dot pattern in order to make the structure easy to understand. Although not illustrated, a second end portion of the resin substrate 104 has the same or similar structure as the first end portion.

The resin substrate 104 differs from the resin substrate 101 according to the first preferred embodiment in that the resin substrate 104 includes a resist film 24 including, on the outer circumference, three protruding portions PR1, PR2, and PR3 protruding along the first main surface. Furthermore, the resin substrate 104 differs from the resin substrate 101 according to the first preferred embodiment in that the coverlay film 1A does not cover the entire or substantially the entire outer circumference of the resist film 24. The other features of the resin substrate 104 are the same as or similar to the features of the resin substrate 101.

Hereinafter, a portion different from the resin substrate 101 according to the first preferred embodiment will be described.

As illustrated in FIG. 7, the protruding portion PR3 is a linear or substantially linear taper with a sharply angled vertex, like the protruding portions PR1 and PR2. All of the protruding portions PR1, PR2, and PR3 have the same or similar shape. The protruding portion PR3 is located between the protruding portion PR1 and the protruding portion PR2, and is located between the exposed portion of the circuit conductor pattern 31 and the exposed portion of the circuit conductor pattern 32.

As illustrated in FIG. 7, the coverlay film 1A does not cover the entire or substantially the entire outer circumference of the resist film 24.

As described in the present preferred embodiment, the coverlay film 1A does not have to cover the entire or substantially the entire outer circumference of the resist film 24. However, to reduce the infiltration of moisture from the outside, for example, the coverlay film preferably covers the entire or substantially the entire outer circumference of the resist film.

As described in the present preferred embodiment, the resin substrate may include three or more protruding portions. Furthermore, as long as at least two of the plurality of protruding portions are located at positions sandwiching the exposed portions of the circuit conductor patterns, the other protruding portions may be located at any position. Note that locating the protruding portion PR3 between the exposed portion of the circuit conductor pattern 31 and the exposed portion of the circuit conductor pattern as in the present preferred embodiment further reduces or prevents the occurrence of short circuits between the circuit conductor patterns 31 and 32 resulting from the infiltration of moisture from the outside when the circuit conductor patterns 31 and 32 have different potentials.

If unintended gaps are formed between the exposed portion of the circuit conductor pattern 31 and the exposed portion of the circuit conductor pattern 32, characteristic changes may occur. For example, the formation of the gap described above causes a change in the dielectric constant between the circuit conductor patterns 31 and 32, and thus the capacitance between the circuit conductor patterns 31 and 32 fluctuates. This is particularly remarkable when the circuit conductor patterns are for high frequency. Thus, the protruding portions are preferably located, for example, between the plurality of circuit conductor patterns or on the circuit conductor patterns to reduce or prevent the formation of unintended gaps.

Fifth Preferred Embodiment

In a fifth preferred embodiment of the present invention, an example in which protruding portions have a different stretching direction from that of the resin substrates described above.

Figure 8A:
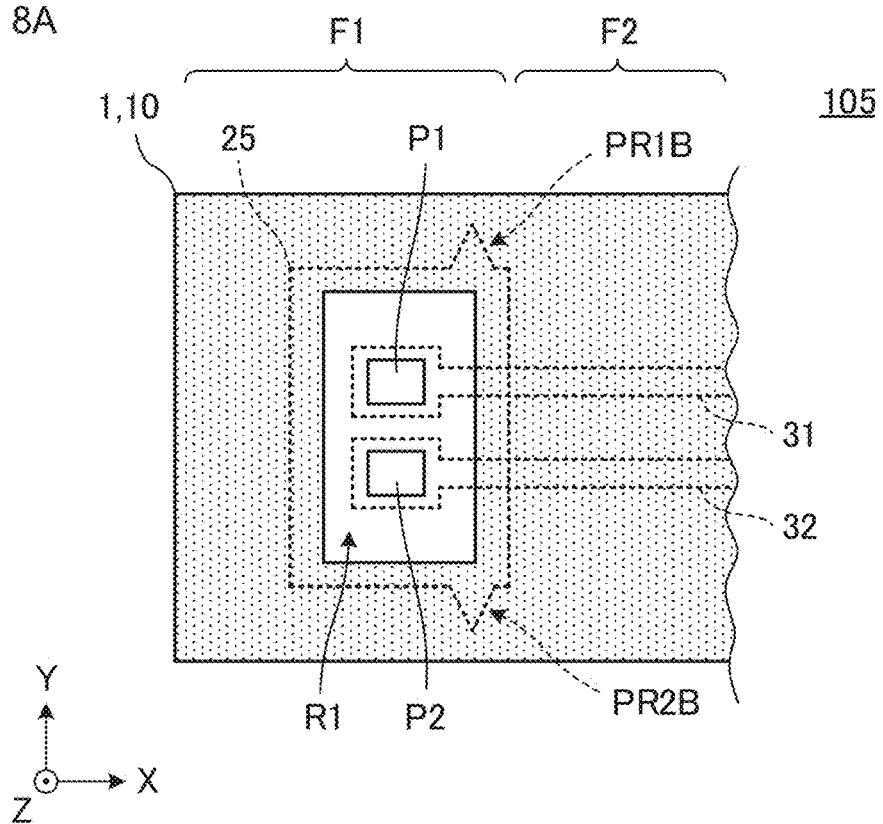
FIG. 8A is an enlarged plan view of a first end portion of a resin substrate according to a fifth preferred embodiment of the present invention.
Figure 8B:
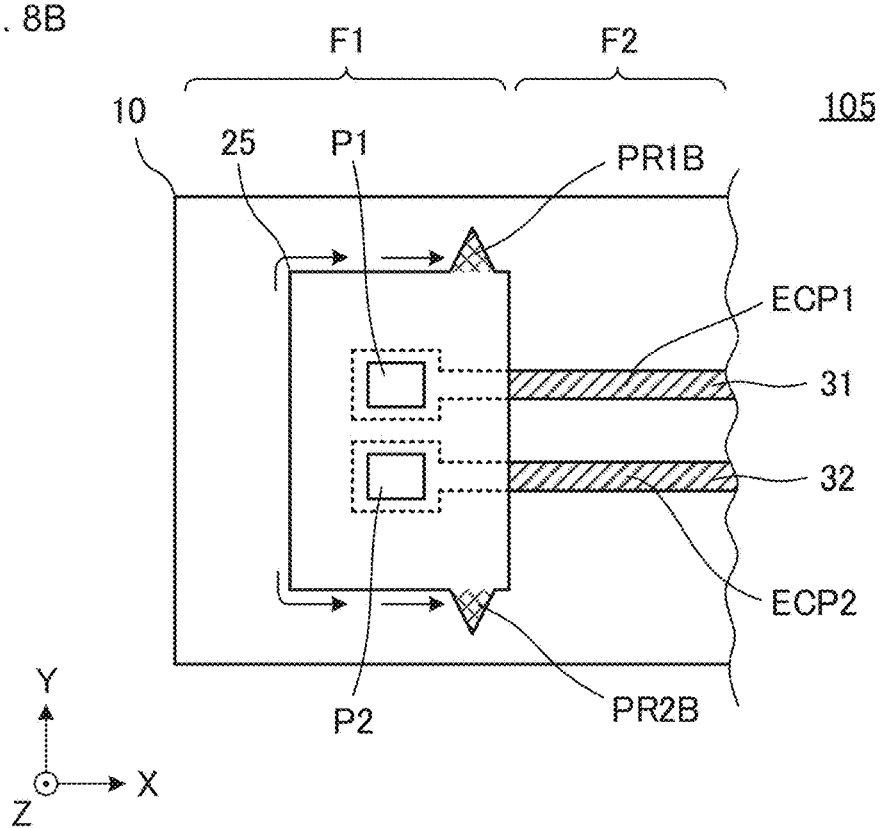
FIG. 8B is an enlarged plan view illustrating the first end portion of the resin substrate, from which a coverlay film is removed.

FIG. 8A is an enlarged plan view of a first end portion of a resin substrate 105 according to the fifth preferred embodiment, and FIG. 8B is an enlarged plan view illustrating the first end portion of the resin substrate 105, from which a coverlay film 1 is removed. In FIG. 8A, the coverlay film 1 is illustrated by a dot pattern in order to make the structure easy to understand. In FIG. 8B, exposed portions of circuit conductor patterns 31 and 32 are illustrated by hatching, and protruding portions PR1B and PR2B are illustrated by cross-hatching. Although not illustrated, a second end portion of the resin substrate 105 has the same or similar structure as the first end portion.

The resin substrate 105 differs from the resin substrate 101 according to the first preferred embodiment in that the resin substrate 105 includes a resist film 25 including the protruding portions PR1B and PR2B on the outer circumference. The other features of the resin substrate 105 are the same as or similar to the features of the resin substrate 101.

Each of the plurality of protruding portions PR1B and PR2B has a tapered shape with one vertex. More specifically, the protruding portion PR1B is a linear substantially linear taper with a sharply angled vertex extending in a +Y direction (second direction orthogonal or substantially orthogonal to the first direction), and is provided on a second side (upper side of the resist film 25 in FIG. 8A and FIG. 8B) of the resist film 25, which is rectangular or substantially rectangular. The protruding portion PR2B is a linear or substantially linear taper with a sharply angled vertex extending in a −Y direction (second direction), and is provided on a third side (lower side of the resist film 25 in FIG. 8A and FIG. 8B) of the resist film 25. In the present preferred embodiment, the two protruding portions PR1B and PR2B are located symmetrically or substantially symmetrically in the Y-axis direction with respect to the center line of the area in which the exposed portions ECP1 and ECP2 of the circuit conductor patterns 31 and 32 to be protected are provided.

As illustrated in FIGS. 8A and 8B, two of the protruding portions PR1B and PR2B are located at positions sandwiching the exposed portions ECP1 and ECP2 of the circuit conductor patterns 31 and 32.

As described above, when the outer circumference of the resist film provided on the first main surface VS1 is covered with the coverlay film 1, moisture may infiltrate into the boundary between the outer circumference of the resist film and the coverlay film 1. If the infiltrating moisture proceeds along the boundary between the outer circumference of the resist film and the coverlay film and reaches the circuit conductor patterns 31 and 32 (see the arrows in FIGS. 8A and 8B), the circuit conductor patterns 31 and 32 may corrode. Accordingly, providing the protruding portions PR1B and PR2B (which are unlikely to form a gap at the boundary between the resin base material 10, the resist film 25, and the coverlay film 1) in the middle of the path along which the infiltrating moisture proceeds as in the present preferred embodiment reduces or prevents corrosion of the circuit conductor patterns 31 and 32 or the like resulting from the infiltrating moisture.

As described in the present preferred embodiment, even if the two protruding portions PR1B and PR2B extend in the second direction (the direction orthogonal or substantially orthogonal to the first direction, in which the circuit conductor patterns 31 and 32 extend), the same or similar advantageous actions and effects as those of the resin substrate 101 according to the first preferred embodiment are able to be provided as long as the above-described two protruding portions are located at positions sandwiching the exposed portions ECP1 and ECP2 of the circuit conductor patterns 31 and 32.

Although, in each of the preferred embodiments described above, an example in which the resin base material 10 is a rectangular or substantially rectangular flat plate with the longitudinal direction coinciding with the X-axis direction, the shape of the resin base material 10 may be modified as appropriate as long as the actions and effects of the present invention are able to be provided. The planar shape of the resin base material may be, for example, a polygonal shape, a circular shape, an elliptical shape, an arc shape, an L shape, a U shape, a Y shape, a T shape, a crank shape, or the like.

Although, in each of the preferred embodiments described above, an example in which the resin base material 10 is a flat plate including a thermoplastic resin as the main material is described, the resin base material is not limited to this structure. The resin base material 10 may be a flat plate including a thermosetting resin sheet. Alternatively, the resin base material 10 may be a composite laminate of a plurality of resins, and for example, may be provided by laminating a thermosetting resin sheet such as a glass/epoxy substrate and a thermoplastic resin sheet. Furthermore, the resin base material 10 is not limited to one in which a plurality of base material layers are heat-pressed (collectively pressed) to fuse their surfaces with each other, and may include an adhesive layer provided between each of the adjacent base material layers.

Although, in each of the preferred embodiments described above, an example in which the resin base material 10 is a laminate of a plurality of base material layers is described, the resin base material is not limited to this structure. The resin base material 10 may be a single-layer flat plate.

Although, in each of the preferred embodiments described above, an example of a resin substrate provided with a rectangular or substantially rectangular resist film is described, the planar shape of the resist film is not limited to this. The planar shape of the resist film may be changed as appropriate as long as the advantageous actions and effects of the present invention are able to be provided and may be, for example, a polygonal shape, a circular shape, an elliptical shape, an arc shape, an L shape, a U shape, a Y shape, a T shape, a crank shape, or the like.

Although, in each of the preferred embodiments described above, an example in which each of the coverlay films 1, 1A is a rectangular or substantially rectangular film provided (attached) on substantially the entire first main surface VS1 is described, the coverlay films are not limited to this structure. The coverlay films do not have to be provided on substantially the entire first main surface VS1, and may be provided on only a portion of the first main surface VS1. Furthermore, the planar shape of the coverlay films is not limited to a rectangle or substantially a rectangle, and may be, for example, a polygonal shape, a circular shape, an elliptical shape, an arc shape, a ring shape, an L shape, a U shape, a Y shape, or a crank shape.

Although, in each of the preferred embodiments described above, an example in which the resist film and the coverlay film are provided only on the first main surface VS1 of the resin base material 10 is described, the films are not limited to this structure. The resist film and the coverlay film may be provided on the second main surface of the resin base material 10.

The circuitry of the resin substrate is not limited to the circuits described in each of the preferred embodiments described above. For example, various transmission lines (for example, strip lines, microstrip lines, coplanar lines, or the like) may be provided on the resin substrate. Furthermore, the resin substrate may be provided with a conductor pattern of, for example, an inductor, a capacitor, or a frequency filter such as various filters (low-pass filter, high-pass filter, band-pass filter, band-elimination filter). Furthermore, various components and elements, for example, chip parts, may be mounted on or embedded in the main surface of the resin substrate.

Although, in each of the preferred embodiments described above, an example of a resin substrate provided with two rectangular or substantially rectangular electrode pads P1 and P2 is described, the resin substrate is not limited to this structure. The number, shape, and arrangement of the electrode pads P1 and P2 may be changed as appropriate according to the circuitry of the resin substrate. The planar shapes of the electrode pads P1 and P2 may be, for example, a polygonal shape, a circular shape, an elliptical shape, an arc shape, a ring shape, an L shape, a U shape, a Y shape, or a crank shape.

Although, in each of the preferred embodiments described above, an example in which the electrode pads P1 and P2 are examples of electrodes for signals is described, the application of the "electrode pads" is not limited to this. The electrode pads may be, for example, ground electrodes to connect to the ground, or may be auxiliary electrodes to position with respect to other components or elements.

Although each of the preferred embodiments described above illustrates an example in which the circuit conductor patterns 31 and 32 are signal lines, the circuit conductor patterns 31 and 32 are not limited to this. The circuit conductor patterns may each be, for example, a conductor pattern defining a coil, or a capacitor electrode defining a capacitor.

Although, in each of the preferred embodiments described above, an example of the resin substrate provided with conductor patterns provided only on the first main surface VS1 of the resin base material 10 is described, the resin substrate is not limited to this structure. The conductor patterns may be provided on the second main surface or the inside of the resin base material 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
   a resin base material including a main surface;
   an electrode pad that is provided on the main surface;
   a resist film that includes, on an outer circumference, a plurality of protruding portions protruding along the main surface, is provided on the main surface, and covers an entire or substantially an entire outer circumference of the electrode pad;
   a circuit conductor pattern that is provided on the main surface and is partially covered with the resist film; and
   a coverlay film that is provided on the main surface and covers a portion of the resist film including the plurality of protruding portions and a portion of an exposed portion of the circuit conductor pattern, the exposed portion not being covered with the resist film; wherein
   each of the plurality of protruding portions has a tapered shape with a vertex; and
   at least two of the plurality of protruding portions are located at positions sandwiching the exposed portion of the circuit conductor pattern.

2. The resin substrate according to claim 1, wherein each of the plurality of protruding portions has a tapered shape with a plurality of the vertices.

3. The resin substrate according to claim 1, wherein
   the circuit conductor pattern extends in a first direction; and
   at least two of the plurality of protruding portions extend in a second direction orthogonal or substantially orthogonal to the first direction.

4. The resin substrate according to claim 1, wherein the tapered shape is a linear or substantially linear taper.

5. The resin substrate according to claim 1, wherein the tapered shape is an exponential taper.

6. The resin substrate according to claim 1, wherein all of the tapered shapes of the plurality of protruding portions are identical or substantially identical.

7. The resin substrate according to claim 1, wherein a number of the plurality of protruding portions is 3 or more.

8. The resin substrate according to claim 1, wherein the coverlay film covers an entire or substantially an entire outer circumference of the resist film.

9. The resin substrate according to claim 1, wherein
   the electrode pad is a first electrode pad;
   a second electrode pad is provided on the main surface; and
   an entire or substantially an outer circumference of the second electrode pad is covered by the resist film.

10. The resin substrate according to claim 9, wherein each of the first electrode pad and the second electrode pad is a rectangular or substantially rectangular conductor pattern.

11. The resin substrate according to claim 1, wherein
    the circuit conductor pattern is a first circuit conductor pattern;
    a second circuit conductor pattern is provided on the main surface; and
    the first circuit conductor pattern and the second circuit conductor pattern are linear or substantially linear conductor patterns.

12. The resin substrate according to claim 11, wherein the first circuit conductor pattern and the second circuit conductor pattern are parallel or substantially parallel to each other.

13. The resin substrate according to claim 1, wherein the circuit conductor pattern is a signal line.

14. The resin substrate according to claim 1, wherein the resist film is a rectangular or substantially rectangular protective film.

15. The resin substrate according to claim 1, wherein the coverlay film includes an opening corresponding to a position of the electrode pad.

16. The resin substrate according to claim 1, wherein none of the plurality of protruding portions is provided on an outer circumference of the resist film.

17. A method for producing a resin substrate, the method comprising:
    a base material forming step of forming a resin base material provided with an electrode pad and a circuit conductor pattern formed on a main surface;
    a resist film forming step of forming a resist film on the main surface after the base material forming step, the resist film including, on an outer circumference, a plurality of protruding portions protruding along the main surface and covering an entire or substantially an entire outer circumference of the electrode pad and a portion of the circuit conductor pattern; and
    a film forming step of forming a coverlay film on the main surface after the resist film forming step, the coverlay film covering a portion of the resist film including the plurality of protruding portions and a portion of an exposed portion of the circuit conductor pattern, the exposed portion not being covered with the resist film; wherein each of the plurality of protruding portions has a tapered shape with a vertex; and at least two of the plurality of protruding portions are located at positions sandwiching the exposed portion of the circuit conductor pattern.

18. The method for producing a resin substrate according to claim 17, wherein each of the plurality of protruding portions has a tapered shape with a plurality of the vertices.

19. The method for producing a resin substrate according to claim 17, wherein the circuit conductor pattern extends in a first direction; and at least two of the plurality of protruding portions extend in a second direction orthogonal or substantially orthogonal to the first direction.

20. The method for producing a resin substrate according to claim 17, wherein the coverlay film covers an entire or substantially an entire outer circumference of the resist film.

* * * * *